AUTOMATED SEMICONDUCTOR DEVICE METHOD AND STRUCTURE

Filed Aug. 16, 1965 5 Sheets-Sheet 1

INVENTORS
Alfred Bauer
Herbert Scholz
Wilhelm Engbert &
Dieter Baumann

BY Spencer & Kaye
ATTORNEYS

INVENTORS
Alfred Bauer
Herbert Scholz
Wilhelm Engbert &
Dieter Baumann
BY Spencer & Kaye
ATTORNEYS

AUTOMATED SEMICONDUCTOR DEVICE METHOD AND STRUCTURE

Filed Aug. 16, 1965 5 Sheets-Sheet 3

INVENTORS
Alfred Bauer
Herbert Scholz
Wilhelm Engbert &
Dieter Baumann

BY Spencer & Kaye
ATTORNEYS

INVENTORS
Alfred Bauer
Herbert Scholz
Wilhelm Engbert &
Dieter Baumann
BY Spencer & Kaye
ATTORNEYS

AUTOMATED SEMICONDUCTOR DEVICE METHOD AND STRUCTURE

Filed Aug. 16, 1965 5 Sheets-Sheet 5

INVENTORS
Alfred Bauer
Herbert Scholz
Wilhelm Engbert &
Dieter Baumann

BY Spencer & Kaye
ATTORNEYS

United States Patent Office 3,281,628

Patented Oct. 25, 1966

3,281,628

AUTOMATED SEMICONDUCTOR DEVICE METHOD AND STRUCTURE

Alfred Bauer, Heilbronn-Weinsberg, Herbert Scholz, Heilbronn, Wilhelm Engbert, Talheim, and Dieter Baumann, Heilbronn, Germany, assignors to Telefunken Patentverwertungs-G.m.b.H., Ulm (Danube), Germany Filed Aug. 16, 1965, Ser. No. 486,585

Claims priority, application Germany, Aug. 14, 1964, T 26,811; June 12, 1965, T 28,783; June 24, 1965, T 28,863

20 Claims. (Cl. 317—234)

The present invention relates to a method for manufacturing semiconductor devices, and particularly to a method for forming contacts in the manufacture of semiconductor units.

It is well recognized that the largest portion of the cost of mass-producing semiconductor devices is incurred in the making of contacts to the various semiconductor regions and in placing the resulting semiconductor devices in suitable housings.

It is a primary object of the present invention to reduce these costs.

It is a more specific object of the present invention to provide a method which simplifies the manufacture of semiconductor devices.

It is another object of the present invention to reduce the costs of manufacturing such devices.

It is yet another object of the present invention to reduce the costs of providing contacts for semiconductor devices.

The present invention achieves these objects, in a method for contacting semiconductor devices, by performing the operations of: providing a metal sheet suitable for the making of contacts and having recesses which divide the sheet into a plurality of strips which are spaced apart from one another but which are joined together at at least one of their ends; providing a semiconductor device constituted by a semiconductor body having at least one electrode on one surface thereof; conductively connecting the semiconductor body to one of the strips; conductively connecting the at least one semiconductor electrode to a respective other one of the strips through a corresponding electrode lead; and subsequently separating the strips from one another and from the remaining portion of the metal sheet in order to permit the strips to be used as electrode leads or as connections to individual electrode leads.

The semiconductor bodies and/or the leads for the semiconductor electrodes are preferably soldered to the strips. It has been found that particularly favorable results are obtained in the practice of the present invention if the contacting metal sheet is formed so as to be ladder-shaped or comb-shaped. In the case where the sheet is in the form of a ladder-shaped band, defined by a plurality of longitudinally spaced cross-pieces, or rungs, joined together by a pair of longitudinal side pieces, it would be possible to convey the band by means of rollers and to facilitate the conveyance and guidance of this band by providing suitable openings along the length of the side pieces. The use of a ladder-shaped band thus lends itself very well to the automation of the above-described method.

The present invention also provides a procedure for attaching the semiconductor body to a conductive strip in such a way as to prevent the formation of a barrier layer between the parts.

The invention is also concerned with semiconductor units produced according to the above-described procedures and with novel forms for the contact-forming sheet.

Additional objects and advantages of the present invention will become apparent upon consideration of the following description when taken in conjuction with the accompanying drawings in which.

Figure 1:
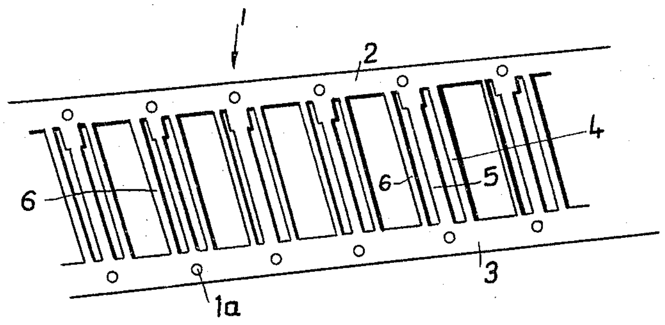
FIGURE 1 is a perspective view of a portion of a preferred form of metal sheet used in the practice of the present invention.

Referring first to FIGURE 1, there is shown a portion of a ladder-shaped band 1 in the form in which it is originally presented for receiving a multiplicity of transistors and/or contacting a mutiplicity of transistor electrode leads in accordance with the present invention. This band is composed of two side pieces, or stringers, 2 and 3, between which there are disposed a plurality of cross-pieces or rungs, constituting the previously-mentioned contacting strips. One group of three rungs 4, 5 and 6 is provided for contacting each transistor. The side pieces 2 and 3 are provided with guide bores *1a* for facilitating the conveyance and guidance of the band 1. The central rung 5 of each group of three rungs is widened in one region for receiving the semiconductor body of the transistor. The two outer rungs 4 and 6 of each group are provided to serve as contacts for the emitter and base electrodes, respectively, of the transistor. The band 1 is produced by any well known process, such as, for example, by punching or etching. The band may be made, for example, of nickel, Kovar (a nickel-iron-cobalt alloy), molybdenum, or other suitable members having coefficients of expansion which correspond to those of the most commonly used semiconductor materials and is preferably gilded after the formation of the recesses between the rungs.

Figure 2:
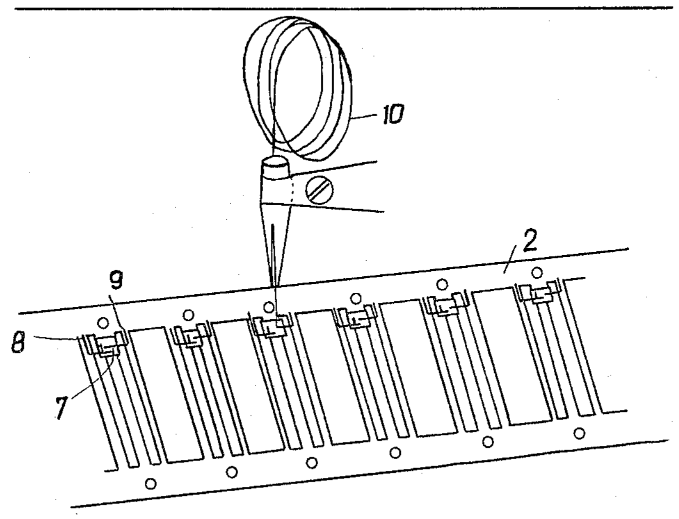
FIGURE 2 is a view similar to that of FIGURE 1 showing the sheet at an intermediate stage in the process of the present invention.

In order to permit the semiconductor bodies to be conductively attached without creating a barrier layer, a gold-antimony foil piece can be welded to the widened portion of each of the rungs 5. As is shown in FIGURE 2, a semiconductor 7 can then be soldered to each of these pieces of foil. According to the preferred application of the present invention, the semiconductor 7 is constituted by a planar transistor whose body serves as the collector region. Therefore, the above-described soldering of the semiconductor to the foil will serve to establish a barrier-layer-free connection with the transistor collector region. In a transistor of this type, the base and emitter regions are located on the upper surface of the semiconductor body and these regions are equipped with suitable electrodes. These electrodes are connected to respective thin wires 8 and 9 which are in turn conductively connected to respective ones of the rungs 4 and 6. The connections of thin wires 8 and 9 to their respective transistor electrodes and rungs can be effected with the aid of a so-called bonder 10 whose mode of operation is well known in the art.

After these contacts have been made, the band 1, with the semiconductor bodies soldered thereon, is immersed in a solution of p-hydroxyacetophenone-D-glucoside ($C_{14}H_{18}O_7$) and is thereafter dried in a suitable drying device for about 5 minutes at about 100° C.

Figure 3:
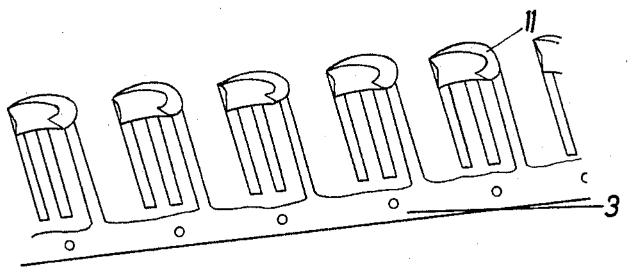
FIGURE 3 is a view similar to that of FIGURE 1 showing the band at a further stage of the process of the present invention.

Thereafter, one side piece of the band, for example the side piece 2, is removed and the individual transistors are embedded in a suitable casting resin by immersing the side of the band on which the transistors are disposed in the resin. An assembly is thus obtained comprising the side piece 3 with the rungs attached thereto and the attached semiconductor devices are no longer visible because each of them is covered by a resin mass. After the immersion in the resin, a pre-hardening process is performed and the remaining exposed glucoside solution is removed by the application of carbon tetrachloride. A ten hour hardening process is then carried out by heating the unit at about 120° C., after which the transistors with the rungs attached thereto can be wholly or partially separated from the other side piece 3. This separation may be carried out so as to produce the structure shown in FIGURE 3, wherein only two rungs of each group are separated from the side piece 3. This arrangement lends itself particularly well to the testing of the electrical parameters of the transistors because the side piece 3 can serve as a common terminal for all of them, the rungs being supported by resin mass 11.

The transistors can then be separated from one another by cutting the side piece 3 into a plurality of segments each of which is attached to one of the transistors. Each transistor is then ready for further processing.

Figure 4:
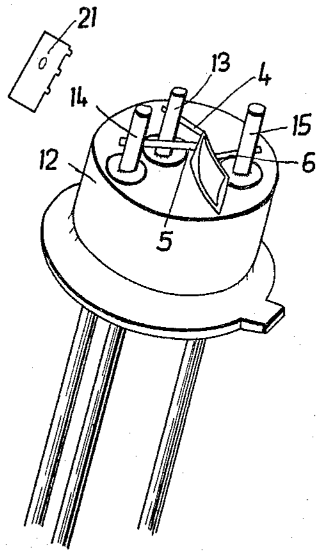
FIGURE 4 is a perspective view showing a semiconductor device produced according to the present invention using a sheet in the form shown in FIGURES 1 to 3.

FIGURE 4 shows one arrangement for mounting each of the transistors so formed on a support 12 by welding the ends of rungs 4, 5 and 6 to respective ones of the posts 13, 14 and 15 mounted in support 12. For this purpose, two of the three rungs may be bent, for example at right angles, in order to permit them to contact their respective posts. Subsequently, the side piece section 21 is separated from the rung to which it was attached. It would also be possible to remove the side piece section 21 prior to attaching the rungs to the conductive posts. Finally, a housing is placed over support 12 so as to seal the transistor assembly.

Figure 5:
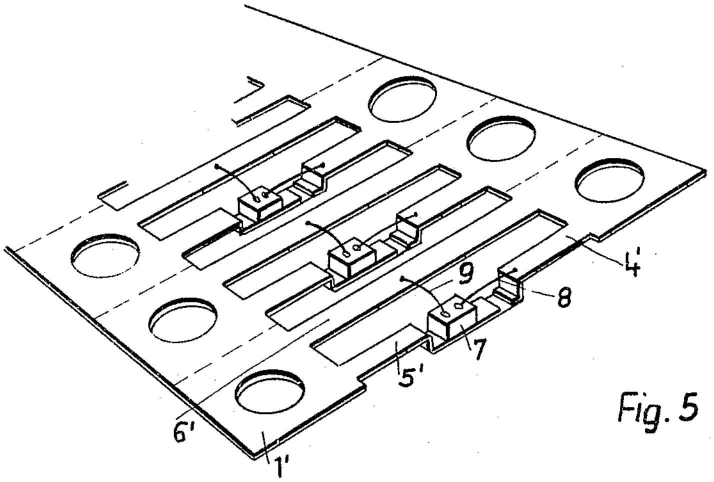
FIGURE 5 is a perspective view showing another form of the metal sheet used in the practice of the present invention.

Turning now to FIGURE 5, there is shown a second form which the ladder-shaped band can take for the practice of the present invention. In this embodiment, each group of rungs is defined by only two rungs formed in the metal strip 1' for the making of contacts to each transistor, the required three contacts for the transistor being provided by dividing one of the rungs into two laterally-spaced sections. As is shown in FIGURE 5, the divided rung is bent, near its center, in the shape of a U to present the rung in the form of two sections 4' and 5' each of which has two right angle bends in the region of its free end. The end portion of one rung, 5' for example, has the semiconductor body of a transistor 7 soldered thereto. This transistor may be again of the planar type having its body constituting the transistor collector. The emitter and base electrode of the transistor are conductively connected to the other section 4' and the rung 6' respectively, through the intermediary of corresponding ones of the leads 8 and 9.

Figure 6:
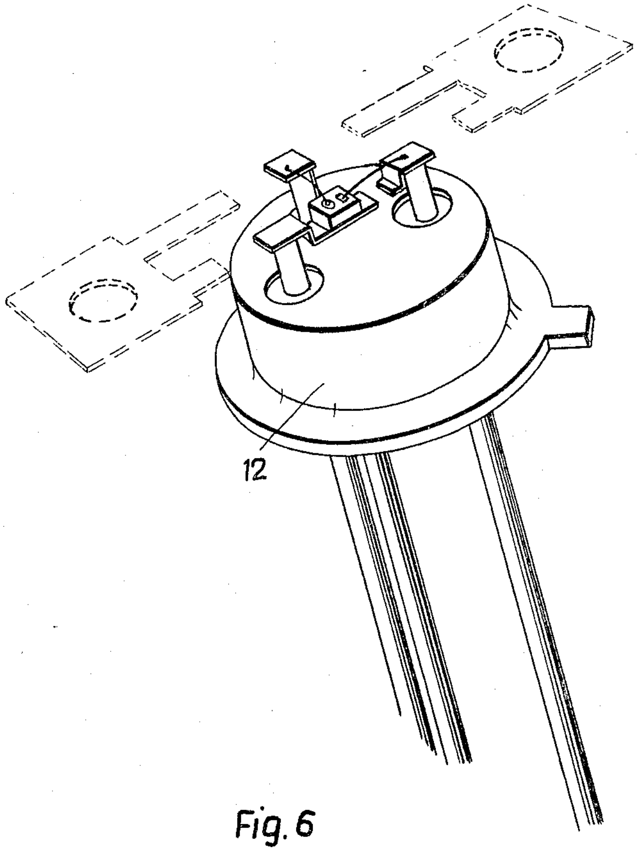
FIGURE 6 is a perspective view showing a semiconductor device produced according to the present invention using a sheet in the form shown in FIGURE 5.

FIGURE 6 shows one of the resulting transistor units mounted on the posts of a base 12, with the corresponding side piece and superfluous rung portions of the metal strip removed, as shown in broken lines in the figure.

The transistor mounting technique illustrated in various forms in FIGURES 1 through 6 is highly advantageous because it lends itself readily to the automation of the transistor assembly fabrication procedures. This is true because the metal strip 1 or 1' can be readily guided over reels by means of the guide bores, such as the bores 1*a* of FIGURE 1, for example, and because the positioning of the soldering devices for the semi-conductor body and the electrode leads is faciliated due to the fact that the rungs are relatively broad and equally spaced.

Figure 7:
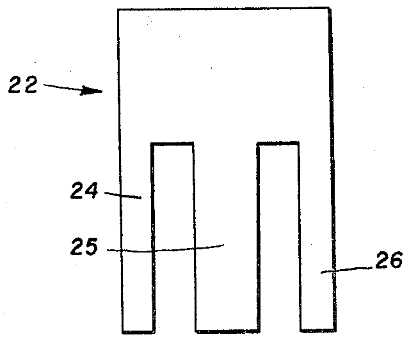
FIGURE 7 is a top view showing still another form for the sheet used in the present invention.
Figure 8:
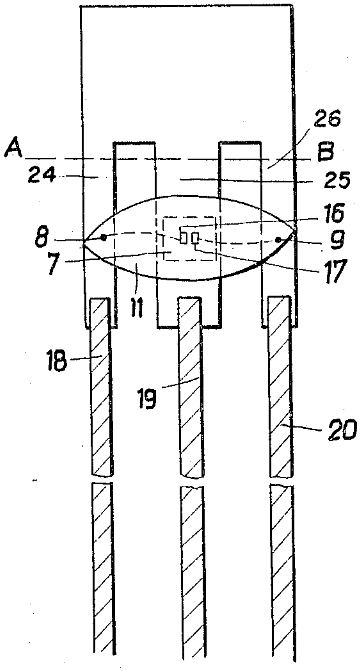
FIGURE 8 is a top view showing an intermediate stage in the process of the present invention using the sheet of FIGURE 7.
Figure 9:
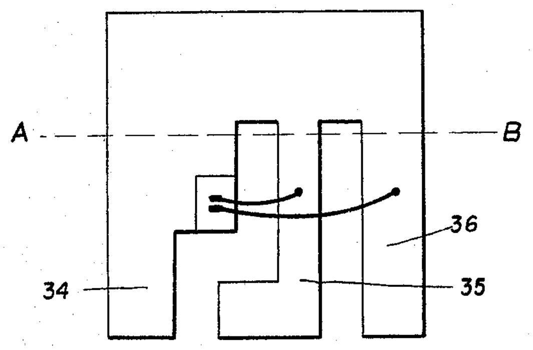
FIGURES 9 and 10 are top views showing two further forms for the sheet used in the practice of the present invention.

Turning now to FIGURES 7 to 9, there are shown several arrangements according to the present invention utilizing a comb-shaped contacting metal sheet for the production of planar transistor assemblies to be mounted in plastic housings. FIGURE 7 shows a comb-shaped contacting plate 22 provided with three teeth or tines, 24, 25 and 26, the surface of which plate is provided with a gold coating having a thickness of about 3 microns. As is shown in FIGURE 8, the semiconductor body 7 of a planar transistor is soldered onto the central tooth 25, by means of a suitable solder, in such a way that the transistor collector portion which is constituted by the semiconductor body contacts tooth 25 in a barrier layer-free manner. Subsequently, the emitter and base electrodes 16 and 17 of the transistor are conductively connected, by means of corresponding wires 8 and 9, with the teeth 24 and 26 of the plate 22. The transistor and its leads 8 and 9, as well as adjacent portions of the teeth, are then covered on one or both sides by a mass of a suitable casting resin 11, the resulting unit then being subjected to a suitable hardening procedure, similar to that previously described herein. The free ends of teeth 24, 25 and 26, which ends are not covered with casting resin, are then conductively connected to respective ones of the lead wires 18, 19 and 20 by soldering or welding. Plate 22 is then cut along the line A–B in order to separate, and electrically isolate, the teeth from one another. The remaining tooth portions then serve as the base, emitter and collector terminals, respectively, for the transistor unit and the mass of resin 11 acts to hold the teeth together as a unit and to insure the maintenance of the desired spacing between them.

The unit thus produced can then be embedded in a plastic, metallic or glass housing. This embedding procedure can be carried out, for example, by filling the housing with casting resin which is initially in the liquid state and by then hardening this resin after the unit has been immersed therein.

According to the present invention, it would also be possible to alter the configuration of the resulting unit by soldering the transistor body, for example, onto one of the outer teeth of the group associated with the transistor and by connecting the transistor terminals to respective ones of the remaining teeth. One form which such a configuration may take is shown in FIGURE 9 wherein the outer tooth 34 of the contacting plate has a widened portion for receiving the transistor semiconductor body. The central tooth 35 of this plate may optionally have a leg portion cut in its free end to facilitate its attachment to the corresponding external lead of the transistor housing. In the case where the semiconductor body constitutes the transistor collector, the transistor base and emitter leads are connected to corresponding ones of the teeth 35 and 36. When the contacting plate has the form shown in FIGURE 9, the semiconductor body will be close enough the center of the resulting unit to ensure that it will be completely surrounded by the subsequently applied mass of casting resin. The unit thus formed is then subjected to the same procedures as those described above in connection with FIGURES 1 to 8, the separation of the teeth from one another being effected by cutting the plate along the line A–B.

Figure 10:
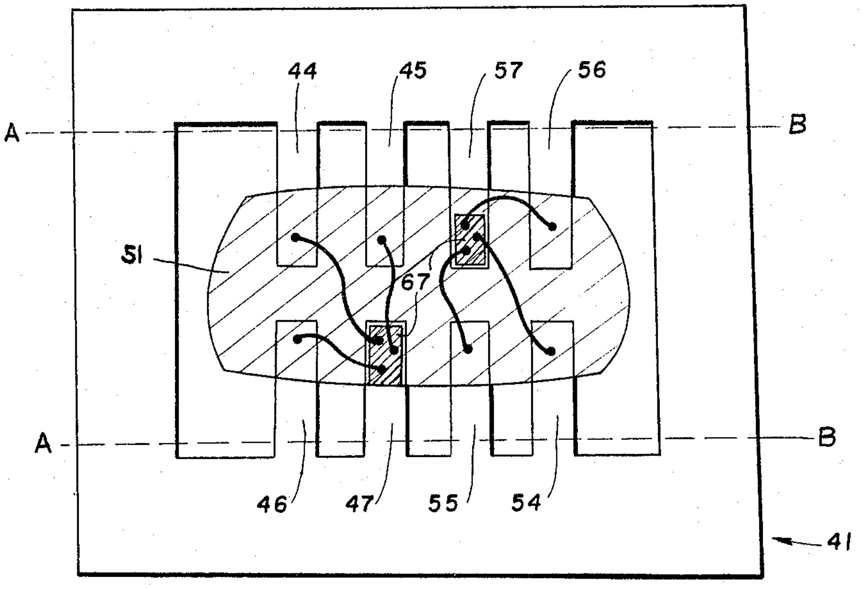

Referring now to FIGURE 10, there is shown yet another form which can be given to the metal sheet in accordance with the practice of the present invention. A sheet having the form shown in this figure is particularly useful when it is desired to extend the principles of the present invention to the fabrication of integrated circuits having a greater number of semiconductor regions than the usual transistor. In the form shown, the metal sheet 41 is constituted by a frame portion supporting two opposed rows of inwardly-extending lateral teeth, with the teeth of each row being spaced from one another. The teeth are arranged in a plurality of groups, the teeth 44, 45, 46 and 47 forming one group and the teeth 54, 55, 56 and 57 forming another group, with each group being arranged to provide contacts for a respective one of the integrated circuits. In the embodiment shown, each group of teeth is arranged for contacting a semiconductor device having a semiconductor support body and three electrodes. Such a device may be constituted, for example, by a semiconductor tetrode or by any other type of integrated circuit having three terminals in addition to the semiconductor body. In addition, if it were desired to provide contacts for a more complicated circuit device, it would only be necessary to increase the number of teeth in each group. A semiconductor device 67 of the above-mentioned type to which connections are to be made is provided for each group of teeth and is soldered to one tooth, 47 or 57, in a manner similar to that set forth for the previously-described arrangements. Each electrode on the semiconductor device is then connected to a respective one of the remaining teeth, such as 44, 45 and 46, of its group, by means of suitable wires. These wires are preferably attached to their associated terminal points on the semiconductor electrode and the teeth with the aid of bonders, as described in connection with FIGURE 2. After all of the contacts have been made, the semiconductor devices 67 and the free ends of the teeth may be formed into a single structural unit by embedding them in a mass of casting resin 51. The teeth may then be separated from the remainder of the metal plate by cutting along the lines A–B to produce a semiconductor device having connection terminals in the form of tooth ends projecting outwardly from the resin mass. The above-described fabrication technique is particularly well adapted for use with semiconductor bodies containing several circuit elements because they result in flat units which can be placed in housings having substantially smaller dimensions than those required for comparable prior art units.

It should be appreciated that the present invention can be used equally well for making contracts to many types of semiconductor devices other than those of the collector-body planar type.

For embedding the semiconductor system, one form of casting resin which can be used is "Araldite," which is a specific type of epoxy resin. "Araldite" is a registered trademark of Ciba, Ltd., Basel, Switzerland. In order to embed the system, the "Araldite" resin can be heated to about 120° C., and hardened for about 12 hours.

One type of bonder suitable for use in the practice of the present invention is shown in the journal "Semiconductor Products and Solid State Technology," February 1965, between the pages 8 and 9 and described on page 50 of the same journal of July 1964.

It will be understood that the above description of the present invention is susceptible to various modifications, changes, and adaptations, and the same are intended to be comprehended within the meaning and range of equivalents of the appended claims.

What is claimed is:

1. A method for contacting semiconductor devices, comprising the steps of:

(a) providing a metal sheet in the form of a ladder having recesses therein which divide said sheet into a plurality of parallel strips constituting ladder rungs which are spaced apart from one another and which are joined together at at least one of their ends by at least one side piece;

(b) providing a semiconductor device constituted by a semiconductor body having at least one electrode on one surface thereof;

(c) conductively connecting said semiconductor body to one of said strips;

(d) conductively connecting said electrode to a respective other one of said strips through the intermediary of a corresponding electrode lead; and (e) separating said strips from one another and from the remaining portion of said metal sheet for enabling said strips to be used as contacts for said semiconductor device.

2. A method as defined in claim 1 wherein said steps of conductively connecting said semiconductor body and said leads to said strips comprise the operation of soldering said semiconductor body and said leads to their respective strips.

3. A method as defined in claim 1, comprising the further steps of embedding the semiconductor body and the strip regions to which the body and the semiconductor electrodes are conductively connected in a mass of insulating material prior to separating the strips from one another.

4. A method as defined in claim 1 comprising the further steps of soldering each of the strips to a respective post of a support for the resulting semiconductor assembly prior to separating said strips from one another.

5. A method as defined in claim 1 wherein the semiconductor body is provided with two electrodes, the strips formed in the metal sheet are in a group of three strips adjacent one another, and the semiconductor body is connected to the central strip of the group while each of the electrodes is conductively connected to a respective one of the remaining strips.

6. A method as defined in claim 1 wherein the metal sheet has a pair of side pieces each of which is joined to a corresponding end of each of the strips, comprising the further steps of:

(a) removing one of the side pieces after the semiconductor body and electrodes have been conductively connected to their respective rungs;

(b) immersing the portions of the rungs to which connections have been made and the semiconductor body in an insulating substance; and (c) separating the rungs from the remaining side piece.

7. A method as defined in claim 1 wherein the metal sheet has the form of a comb having parallel teeth constituting the strips and having a side piece to which one end of each of the strips is joined, comprising the further steps of:

(a) embedding the portions of the teeth to which connections are made and the semiconductor body in an insulating substance; and (b) separating the strips from the side piece.

8. A method as defined in claim 1 comprising the further steps of inserting the resulting unit in a housing.

9. A method as defined in claim 1 wherein the semiconductor device is in the form of an integrated circuit device and the metal sheet is formed with a frame portion having two sets of inwardly extending parallel teeth which constitute the strips, each set of teeth extending from a respective one of two opposing sides of the frame member, and wherein the semiconductor body is mounted on a tooth of one of the sets of teeth while at least one of the electrodes on said body is connected to a tooth of the other one of said sets, comprising the further steps of embedding the portions of the teeth to which connections are made and the semiconductor body in an insulating substance prior to separating the teeth from one another.

10. A method as defined in claim 1 wherein the step of providing a metal sheet comprises the operation of punching out the sheet in order to provide the strips.

11. A method as defined in claim 1 wherein the step of providing a sheet comprises etching out portions of a sheet to form the strips.

12. A method as defined in claim 1 wherein the semiconductor body is connected to said one of said strips in a barrier layer-free manner.

13. A device for use in manufacturing semiconductor units, comprising:

(a) a sheet of conductive material having at least one group of parallel, laterally extending strips which are longitudinally displaced from one another, and at least one longitudinal side piece to which one end of each of said strips is attached;

(b) at least one semiconductor unit constituted by a semiconductor body on one surface of which is disposed at least one electrode; and (c) connecting means connecting each said semiconductor body to one of the strips of each said group in a barrier layer-free manner and conductively connecting each said electrode to a corresponding one of the remaining strips of said group.

14. A device as defined in claim 13, wherein said at least one side piece comprises a pair of longitudinally extending side pieces each of which is connected to a respective end of each of said strips.

15. A device as defined in claim 14, wherein each of said groups comprises two parallel strips and wherein one of the strips of each said group is divided into a pair of laterally displaced, electrically isolated segments having said semiconductor body connected to one of said segments and one of the electrodes on said body connected to the other of said segments.

16. A device as recited in claim 13 wherein said at least one side piece is in the form of a frame member having two longitudinal sides and wherein each of said strips has one of its ends connected to one of said longitudinal sides.

17. A device as defined in claim 13 wherein each of said strips to which a semiconductor body is connected is widened in the region of attachment of said body.

18. A device as defined in claim 13 wherein said sheet has a plurality of longitudinally displaced guide bores formed in said side piece for the automatic guidance and conveyance of said sheet.

19. A device as defined in claim 13 wherein said sheet is made of a material having a coefficient of expansion corresponding to that of the material of said semiconductor body.

20. A device as defined in claim 13 wherein said sheet is made of a metal chosen from the group consisting of nickel, Kovar and molybdenum.

References Cited by the Examiner

UNITED STATES PATENTS

| | | | |
|---|---|---|---|
| 2,434,967 | 1/1948 | Skinker et al. | 317—234 |
| 2,750,654 | 6/1956 | Owens | 29—25.3 |
| 3,025,439 | 3/1962 | Anderson. | |
| 3,118,016 | 1/1964 | Stephenson | 174—68.5 |
| 3,171,187 | 3/1965 | Ikeda et al. | 29—25.3 |
| 3,184,658 | 5/1965 | Littlepage et al. | 317—234 |

JOHN W. HUCKERT, *Primary Examiner.*

R. SANDLER, *Assistant Examiner.*